United States Patent
Petroianu (10) Patent No.: US 11,108,367 B2
(45) Date of Patent: Aug. 31, 2021

(54) INTERNAL POWER SUPPLY FOR AMPLIFIERS

(71) Applicant: SEMICONDUCTOR COMPONENTS INDUSTRIES, LLC, Phoenix, AZ (US)

(72) Inventor: Alexandra-Oana Petroianu, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 138 days.

(21) Appl. No.: 16/512,922

(22) Filed: Jul. 16, 2019

(65) Prior Publication Data

US 2020/0252038 A1    Aug. 6, 2020

Related U.S. Application Data

(60) Provisional application No. 62/800,633, filed on Feb. 4, 2019.

(51) Int. Cl.
*H03F 3/04*    (2006.01)
*H03F 3/45*    (2006.01)

(52) U.S. Cl.
CPC ... *H03F 3/45928* (2013.01); *H03F 2200/513* (2013.01)

(58) Field of Classification Search
CPC .... H03F 1/0211; H03F 3/04; H03F 2200/511; H03F 2200/513; H03F 2200/516
USPC .......................................................... 330/297
See application file for complete search history.

(56) References Cited

U.S. PATENT DOCUMENTS

2009/0174479 A1    7/2009    Yan et al.
2010/0164631 A1*   7/2010    Schneider ........... H03F 3/45955
                                                           330/297

OTHER PUBLICATIONS

Prakash, et al., "Extending Beyond the Max Common-Mode Range of Discrete Current-Sense Amplifiers," TI Tech Notes, SBOA198—Jul. 2017.
Norhholt, "Extending Op Amp Capabilities by Using a Current-Source Power Supply," IEE Trans. Circuits and Systems, vol. CAS-29, No. 6, Jun. 1982.
Huijsing, "SEC. 9.6.1," Operational Amplifiers, Theory and Design, 2001, (One page).

* cited by examiner

*Primary Examiner* — Steven J Mottola
(74) *Attorney, Agent, or Firm* — Brake Hughes Bellermann LLP (57) ABSTRACT

An internal power supply for an amplifier is disclosed. The internal power supply floats according to a common mode voltage at the input to the amplifier and according to an input voltage at an input stage of the amplifier. Powering the input stage of the amplifier using the floating supply allows for the use of low voltage devices even when the range of possible common mode voltages includes high voltages. The use of low voltage devices can correspond to performance improvement for the amplifier and can help reduce the size of the amplifier. The internal supply can accommodate both positive and negative common mode voltages and can be used for current sense amplifiers of any gain.

19 Claims, 11 Drawing Sheets

INTERNAL POWER SUPPLY FOR AMPLIFIERS

CROSS-REFERENCE TO RELATED APPLICATIONS

This application claims the benefit of U.S. Provisional Patent Application No. 62/800,633, filed on Feb. 4, 2019, the entire contents of which is incorporated herein by reference.

FIELD OF THE DISCLOSURE

The present disclosure relates to microelectronic integrated circuits (ICs) and more specifically to an amplifier with an internal power supply that floats to power a low voltage (LV) input stage of an amplifier.

BACKGROUND

In order to accommodate a range of common mode input voltages, an input stage (i.e., core amplifier) of an amplifier can be designed using devices that are rated for the entire range of common mode voltages. In some circumstances, this requires the input stage of the amplifier to be designed using high-voltage (HV) devices (e.g., transistors). This approach, however, can reduce the overall performance of the amplifier.

SUMMARY

Accordingly, in one aspect, the present disclosure describes a system that includes an external power supply and an amplifier. The external power supply is configured to generate a fixed voltage range defined by an upper external voltage ($V_{DD}$) and a lower external voltage ($V_{GND}$). The external power supply is coupled to the amplifier, which is configured to receive an input signal that has a common-mode voltage ($V_{CM}$) within a range of common-mode voltages.

The amplifier in the system includes an internal power supply, a low voltage (LV) core amplifier, and at least one output stages. The LV core amplifier operates at a low voltage (i.e., low in relation to the range of common-mode voltages) and is configured to amplify an input voltage ($V_{IN}$). The internal power supply provides power to the LV core amplifier for operation and is configured to generate a floating voltage range that is defined by an upper internal voltage ($V_{INTP}$) and a lower internal voltage ($V_{INTN}$). The at least one output stage is powered by the external power supply and is configured to level-shift an output of the LV core amplifier from the floating voltage range to an output voltage range that corresponds to (e.g., is equivalent to) the fixed voltage range.

In another aspect, the present disclosure describes a method for operating an amplifier that uses low voltage devices over a high voltage range of common mode voltages that includes positive and negative voltages. In the method, a fixed voltage range, defined by an upper external voltage ($V_{DD}$) and a lower external voltage ($V_{GND}$), is received at the amplifier. Additionally, a common mode voltage, in the high voltage range of common mode voltages, is received at an input to the amplifier. A voltage maximum ($V_{MAX}$) and a voltage minimum ($V_{MIN}$) are then selected from $V_{DD}$, $V_{GND}$, and $V_{CM}$, and a floating voltage range is generated to power the input stage of the amplifier. The floating voltage range is level-shifted to $V_{MAX}$ or $V_{MN}$ according to an input voltage ($V_{IN}$) to the input stage of the amplifier.

In another aspect, the present disclosure describes an internal power supply for an amplifier that is configured to receive a range of common mode voltages that includes positive and negative voltages. The internal power supply includes a selector circuit that receives a common mode voltage ($V_{CM}$) from the input of the amplifier and also receives an upper external voltage ($V_{DD}$) and a lower external voltage ($V_{GND}$) from an external power supply. The selector circuit is configured to select a maximum voltage ($V_{MAX}$) and a minimum voltage ($V_{MIN}$) from $V_{DD}$, $V_{CM}$, and $V_{GND}$. The internal power supply also includes a floating supply circuit that receives $V_{MAX}$ and $V_{MIN}$ from the selector circuit. Additionally, the internal power supply receives an input voltage from an input stage of the amplifier. The floating supply circuit is configured to generate a floating voltage range that is defined by an upper internal voltage ($V_{INTP}$) and a lower internal voltage ($V_{INTN}$) and that is level-shifted to $V_{CM}$ based on $V_{IN}$.

The foregoing illustrative summary, as well as other exemplary objectives and/or advantages of the disclosure, and the manner in which the same are accomplished, are further explained within the following detailed description and its accompanying drawings.

DETAILED DESCRIPTION

The present disclosure describes an amplifier having a floating internal power supply (i.e., internal power supply) for generating a regulated voltage in a low voltage range. The regulated voltage is used to supply an input stage (i.e., core amplifier) so that it may receive an input voltage in a high voltage range. The regulated voltage is level-shifted (i.e., floated) to a voltage ($V_{IN}$) appearing at an input stage so that the core amplifier may operate using low voltage (LV) devices, which can offer an improved performance (e.g., relative to a core amplifier that uses high voltage (HV) devices).

The disclosed circuits and techniques can be used for general purpose amplifiers or current sense amplifiers and can be used with amplifiers that operate with a unidirectional (e.g., positive) or a bidirectional (e.g., positive and negative) power supply and/or common mode input voltages. The disclosed circuits and techniques can reduce the number of HV devices in the amplifier required for operation with HV input common mode voltages and/or a HV external power supply voltages.

A reduction of the HV devices in the amplifier can result in a performance improvement. The performance improvement of the amplifier may correspond to an improvement (e.g., reduction) of a voltage offset ($V_{OS}$), an improvement (e.g., increase) of a common-mode rejection ratio (CMRR), and/or an improvement (e.g., reduction) of a die area for (e.g., required for) the amplifier. For example, the disclosed circuits and techniques may result in a $V_{OS}$ that is approximately constant over a range of input common mode voltages.

Variations in common mode voltage ($V_{CM}$) can change a bias point of a differential pair in the input stage of a typical amplifier due of mismatches between the devices in the input differential pair. This change is pronounced when HV devices are used. The mismatch may affect the amplifier's performance. For example, a range of $V_{CM}$ at the input of an amplifier using HV devices in the input stage can result in an input offset voltage ($V_{OS}$) that is above a level desirable for precision applications, such as current sensing. On the other hand, an input stage with a differential pair including LV devices can be better matched. The improved matching decreases the variability in performance with $V_{CM}$. The LV devices, however, cannot handle a wide range of $V_{CM}$. Thus, using HV devices in an input stage can accommodate a wide range of $V_{CM}$ but can reduce the performance of the amplifier and increase the overall size of the amplifier. Schemes, such as chopping architectures, have been devised to improve the performance of amplifiers using HV devices. These approaches, however, can significantly add complexity. The amplifiers described herein address these issues in that they handle wide variations in $V_{CM}$ with high performance (e.g., comparable to chopping architectures) but without significant added complexity.

Figure 1:
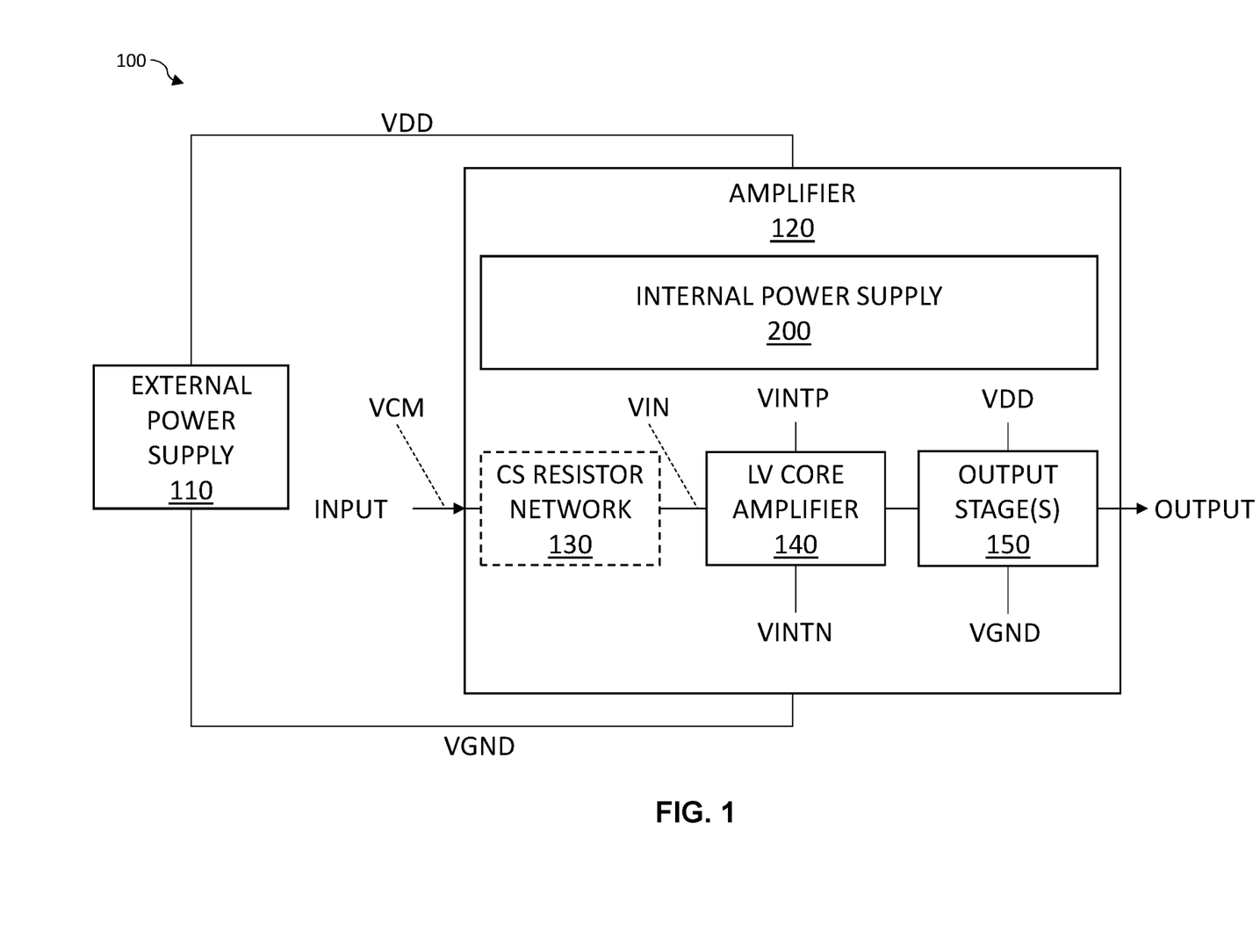
FIG. 1 is a block diagram of a system for amplification according to an implementation of the present disclosure.

FIG. 1 is a block diagram of a system for amplification (i.e., system). The system 100 includes an external power supply 110 that generates voltages in a fixed voltage range defined by an upper (i.e., relatively positive, positive) external voltage ($V_{DD}$) and a lower (i.e., relatively negative, negative) external voltage ($V_{GND}$). The lower external voltage is negative in relation with (i.e., less than) the positive external voltage and not necessarily negative in an absolute sense. For example, $V_{GND}$ may be zero volts, while $V_{DD}$ may be 5 volts. The voltages $V_{DD}$ and $V_{GND}$ area applied to an amplifier 120 to enable operation of certain circuits (e.g., an internal power supply, at least one output stage 150, etc.).

In a possible implementation, the amplifier 120 may be a general purpose amplifier (GPA), which can be configured for various functions (e.g., buffer amplifier, inverting amplifier, summing amplifier, etc.) through feedback. In another possible implementation, the amplifier 120 may be a current sense amplifier (CSA). In the CSA implementation, the amplifier 120 may include a current sense (CS) resistor network 130 to sense a current and to provide a gain.

The amplifier 120 includes various stages to provide functions to receive an input signal (i.e., input) and provide an output signal. The amplifier 120 may be configured to amplify an input signal defined as a voltage different between a relatively positive (i.e., positive) input terminal (INP) of the amplifier 120 and a relatively negative (i.e., negative) input terminal (INN) of the amplifier. In some cases, the input signal includes a common mode voltage ($V_{CM}$), and in some applications, such current sensing, it is desirable to ignore, reduce, or eliminate the $V_{CM}$. Accordingly, a differential amplifier that responds only to voltage differences may be included in the amplifier to effectively eliminate the $V_{CM}$. As shown in FIG. 1 the amplifier 120 includes a core amplifier (i.e., input stage, first stage, etc.) 140 to perform this function. In some implementations, a common mode voltage ($V_{CM}$) of the amplifier can be the average of the input voltages appearing at each of a pair of differential inputs to the amplifier, or: $V_{CM}$=(INP_AMP+INN_AMP)/2.

The core amplifier 140 can amplify a voltage difference at its input (i.e., INP_AMP_INN_AMP) using a differential pair of transistors provided that the transistors are biased appropriately. For example, if the voltage difference at the input of the core amplifier is 5V but the common mode voltage is 20V then the core amplifier can (e.g., must) be powered by at least the common mode voltage in order to perform the voltage difference amplification. This condition implies that high power supply voltages and/or transistors with high voltage ratings (i.e., HV transistors) can (e.g., must) be used for the core amplifier if large $V_{CM}$ are possible. As discuss previously, however, high voltage transistors in the input stage (i.e., core amplifier 140) can negatively affect the overall size and performance of the amplifier 120. For example, accommodating a range of $V_{CM}$ using HV devices and/or high power supplies may lead to amplifiers that have large (e.g., >5 millivolt (mV)) $V_{OS}$ variations or the range of $V_{CM}$.

The disclosed circuits and techniques can accommodate for a range of $V_{CM}$ that includes high voltages with a low voltage (LV) core amplifier 140 that includes low voltage devices (e.g., transistors) to avoid the reduction in performance. To enable operation of the LV core amplifier 140 with low voltage devices, the amplifier 120 includes an internal power supply 200 capable of floating with $V_{CM}$ so that the LV core amplifier 140 is properly biased to amplify the difference signal (i.e., INP_AMP–INN_AMP) regardless of the $V_{CM}$ at the input.

The internal power supply 200 (i.e., internal floating power supply) is configured to generate a floating voltage range defined by an upper internal voltage ($V_{INTP}$) and a lower internal voltage ($V_{INTN}$), the floating voltage range is level-shifted to a voltage based on a $V_{CM}$ at the input of the amplifier 120 and based on an a voltage ($V_{IN}$) at the input of the core amplifier 140 so that the output of the core amplifier is in a first voltage range that corresponds to (e.g., is equivalent to) the floating voltage range (i.e., $V_{INTN}$ to $V_{INTP}$).

The amplifier 120 further includes at least one output stage 150 to convert the first voltage range at the output of the LV core amplifier 140 to a second (i.e., output) voltage range at the output of the amplifier 120. The second voltage range at the output of the amplifier corresponds to (e.g., is equivalent to) the voltage range provided by the external power supply 110 (i.e., the fixed voltage range, $V_{GND}$ to $V_{DD}$). The one or more output stages may function to convert (e.g., level shift) high voltages to low voltages or convert low voltages to high voltages depending on the implementation. Accordingly, the output stage(s) may include HV devices to perform the conversion. The inclusion of HV devices after the input stage does not significantly affect the overall performance of the amplifier 120.

The use of the terms high voltage (HV) and low voltage (LV) are relative to the scenario of a particular fixed voltage range provided to an amplifier designed for a $V_{CM}$ of zero. Voltages outside this particular fixed range can be considered as high voltages while voltages within this particular fixed range can be considered as low voltages. In one possible implementation the particular fixed voltage range is 5V (i.e., VDD=+5V, VGND=0V). Based on this scenario, a $V_{CM}$ in the range of 0V to +5V can be considered as a low voltage, while a $V_{CM}$ that is less than 0V or greater than +5V can be considered as a high voltage. The disclosed circuits and techniques allow the LV core amplifier to operate over a range of common mode voltages that may include high and low voltages and that may include positive or negative voltages. For the scenario described above (i.e., $V_{DD}$=+5V, $V_{GND}$=0V), $V_{CM}$ may be in a range of −80V to +80V. One advantage of the disclosed circuits and techniques is that they can accommodate a range of $V_{CM}$ that may include both positive and negative voltages.

Figure 2:
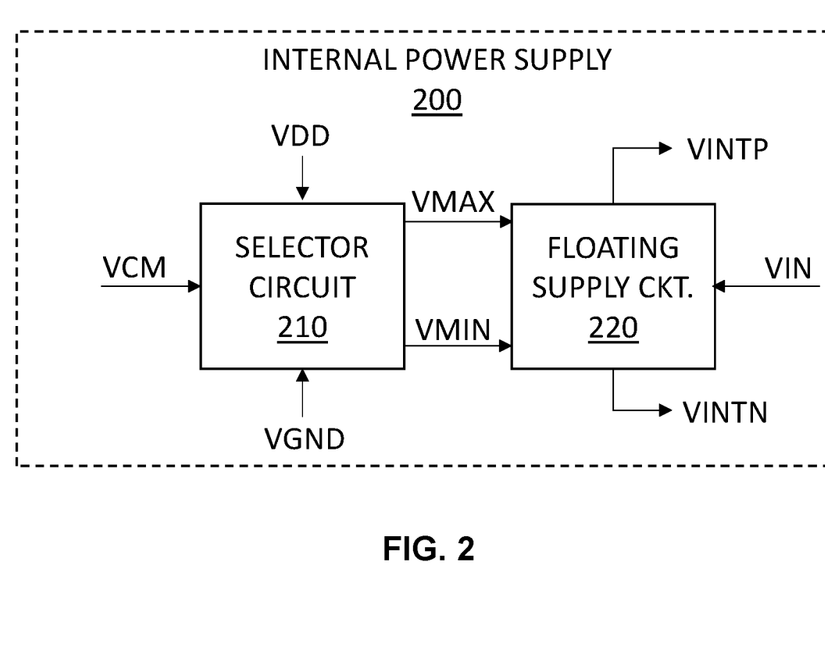
FIG. 2 is a block diagram of an internal power supply for an amplifier according to an implementation of the present disclosure.

FIG. 2 is a block diagram of an implementation of the internal power supply 200 for the amplifier 120. The internal power supply 200 includes a selector circuit 210 that receives $V_{DD}$ and $V_{GND}$ from the external power supply 110 and that receives $V_{CM}$ from the input of the amplifier 120. The selector circuit 210 is configured to select a maximum voltage ($V_{MAX}$) and a minimum voltage ($V_{MIN}$) from the received $V_{DD}$, $V_{CM}$, and $V_{GND}$ and to provide (i.e., output) these voltages to a floating supply circuit 220.

Figure 3A:
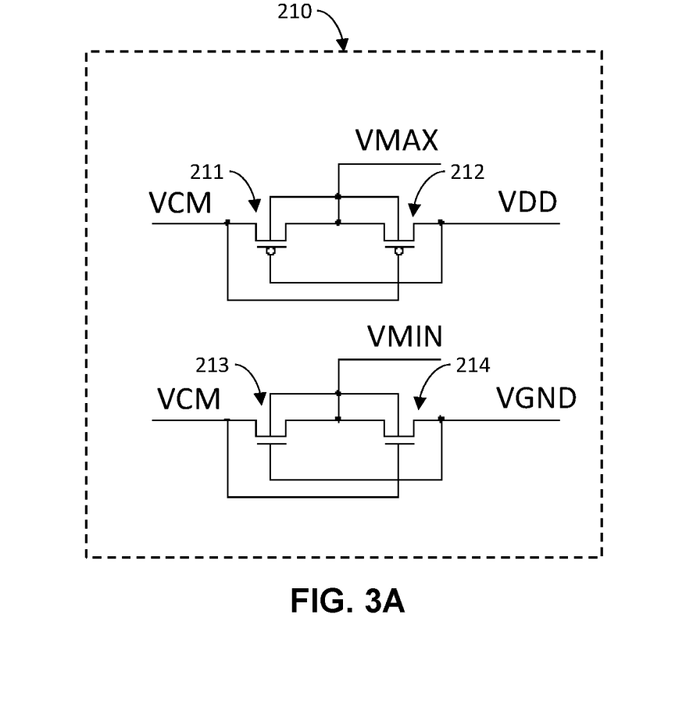
FIG. 3A is a schematic of a first possible implementation of the selector circuit for the internal power supply shown in FIG. 2.

The selector circuit 210 may be implemented in a variety of ways. FIG. 3A is a schematic of a first possible implementation of the selector circuit 210. To determine $V_{MAX}$, a pair of drain-connected PMOS transistors are coupled between, and switched by, $V_{CM}$ and $V_{DD}$. For example, when $V_{DD}$ is lower than $V_{CM}$, then a first p-type metal oxide semiconductor (PMOS) transistor 211 turns ON (i.e., conducts) while a second PMOS transistor 212 turns OFF (i.e., opens) so that $V_{CM}$ is coupled to an output, $V_{MAX}$. Alternatively, when $V_{CM}$ is lower than $V_{DD}$, then the second PMOS transistor 212 turns ON (i.e., conducts) while the first PMOS transistor 211 turns OFF (i.e., opens) so that $V_{DD}$ is coupled to the output, $V_{MAX}$. $V_{GND}$ need not be considered when determining $V_{MAX}$ because it is assumed that $V_{GND}$ is less than $V_{DD}$.

To determine $V_{MIN}$ in the selector circuit of FIG. 3A, a pair of drain-connected n-type metal oxide semiconductor (NMOS) transistors is coupled between, and switched by, $V_{CM}$ and $V_{GND}$. For example, when $V_{GND}$ is higher than $V_{CM}$, a first NMOS transistor 213 turns ON (i.e., conducts) while a second NMOS transistor 214 turns OFF (i.e., opens) so that $V_{CM}$ is coupled to an output, $V_{MIN}$. Alternatively, when $V_{CM}$ is higher than $V_{GND}$, then the second NMOS transistor 214 turns ON (i.e., conducts) while the first NMOS transistor 213 turns OFF (i.e., opens) so that $V_{GND}$ is coupled to the output, $V_{MIN}$. $V_{DD}$ need not be considered when determining $V_{MIN}$ because it is assumed that $V_{DD}$ is higher than $V_{GND}$.

Figure 3B:
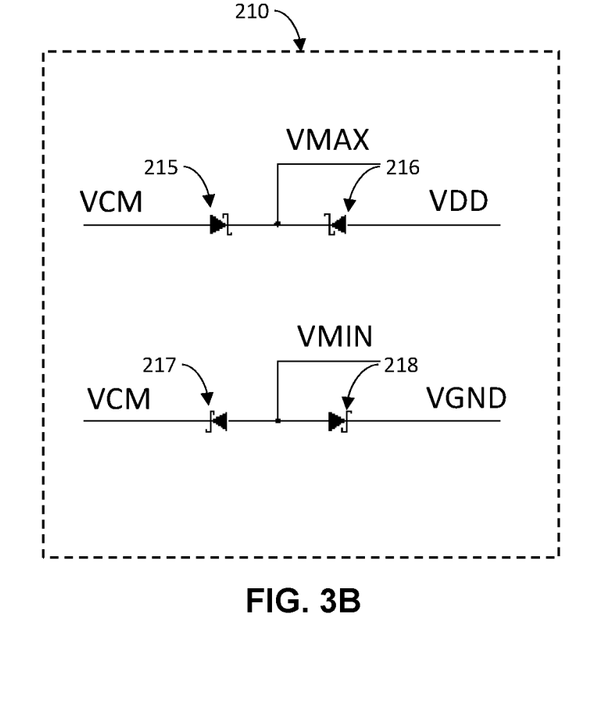
FIG. 3B is a schematic of a second possible implementation of the selector circuit for the internal power supply shown in FIG. 2.

FIG. 3B is a schematic of a second possible implementation of the selector circuit 210 for the internal power supply shown in FIG. 2. The selector circuit includes a first pair of cathode connected Schottky diodes cathode connected between $V_{CM}$ and $V_{DD}$ to determine $V_{MAX}$. For example, when $V_{CM}$ is greater than $V_{DD}$ then a first Schottky diode 215 may couple $V_{CM}$ to an output, $V_{MAX}$, and when $V_{DD}$ is greater than $V_{CM}$, then a second Schottky diode 216 may couple $V_{DD}$ to the output, $V_{MAX}$. The selector circuit shown in FIG. 3B also includes a second pair of anode connected Schottky diodes cathode connected between $V_{CM}$ and $V_{GND}$ to determine $V_{MIN}$. For example, when $V_{CM}$ is lower (i.e., less) than $V_{GND}$, then a third Schottky diode 217 may couple $V_{CM}$ to the output, $V_{MIN}$, and when $V_{GND}$ is lower than $V_{CM}$, then a fourth Schottky diode 218 may couple $V_{GND}$ to the output, $V_{MIN}$.

As mentioned previously, the internal power supply 200 also includes a floating supply circuit 220. The floating supply circuit 220 receives the selected $V_{MAX}$ and $V_{MIN}$ from the selector circuit 210. Additionally, the floating supply circuit 220 receives an input voltage ($V_{IN}$) from the input to the LV core amplifier 140. In some implementations (e.g., the GPA), $V_{IN}$ is equivalent to $V_{CM}$, while in other implementations (e.g., the CSA), $V_{IN}$ may differ from $V_{CM}$ due to the resistor network 130 for current sensing. Further, it should be noted that, in some implementations, $V_{IN}$ might be received at the floating supply circuit 220 from the positive input terminal (INP_AMP) of the core amplifier 140, while in other implementations $V_{IN}$ may be received at the floating supply circuit 220 from the negative input terminal (INN_AMP) of the core amplifier 140. Based on the received voltages, the floating supply circuit 220 is configured to generate a voltage range defined by an upper (i.e., relatively positive) internal voltage ($V_{INTP}$) and a lower (i.e., relatively negative) internal voltage ($V_{INTN}$), which are provided to the LV core amplifier 140 for operation.

Figure 4:
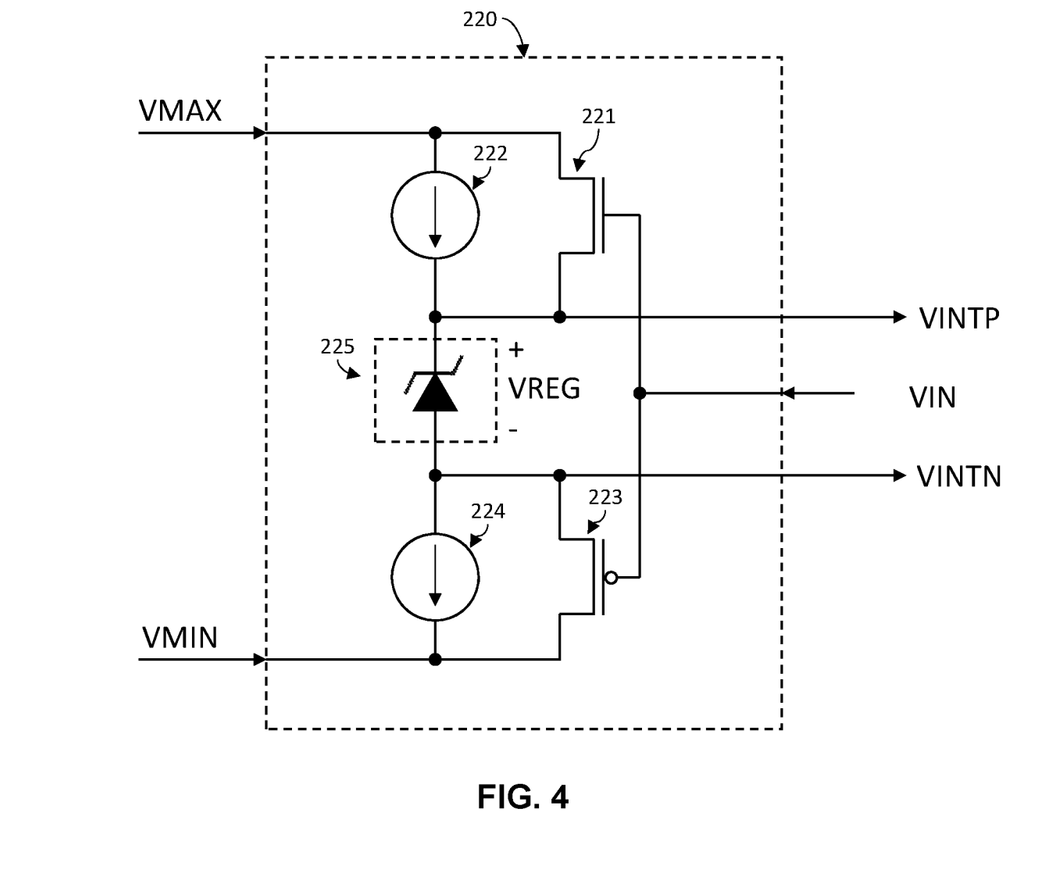
FIG. 4 is a schematic of a possible implementation of the floating supply circuit for the internal power supply shown in FIG. 2.

FIG. 4 is a schematic of a possible implementation of a floating supply circuit 220 for the internal power supply 200. The circuit includes an NMOS transistor 221 and a PMOS transistor 223 that are controlled based on the input voltage ($V_{IN}$) to the LV core amplifier to operate in a complementary fashion. For example, the PMOS transistor 223 and the NMOS transistor 221 are configured so that when the NMOS transistor 221 is controlled (e.g. by VIN) to pass (i.e., regulate) a voltage, the PMOS transistor 223 is controlled to not pass (i.e., regulate) a voltage, and vice versa. The complementary operation may be achieved through fabrication (e.g., channel dimensioning) or via a bias voltage that can applied to a gate of either the NMOS transistor 221 or the PMOS transistor 223 to compensate for differences, thereby insuring complementary operation.

The floating supply circuit effectively level shifts (i.e., floats) a regulated voltage range ($V_{REG}$) that is determined by a regulation device 225 (e.g., a voltage regulation device). The regulation device 225 may be selected/adjusted to provide a LV voltage range, which in some implementations may be approximately the range generated by the external power supply. For example, if $V_{DD}$−$V_{GND}$=5V then $V_{REG}$ may be configured as approximately 5V (e.g., 6V). The regulation device 225 may be a Zener diode or other regulating device (e.g., a PN diode, a diode-connected transistor, etc.). When a Zener diode is used as the regulation device 225, the breakdown voltage of the Zener diode corresponds to $V_{REG}$.

The floating supply circuit 220 may pull-up (i.e., float, regulate, set, etc.) the regulated voltage range to $V_{MAX}$ using the sourcing current source 222 and the NMOS transistor 221. For example, if $V_{CM} > V_{DD}$ (i.e., $V_{MAX} = V_{CM}$) then the NMOS transistor 221 and the sourcing current source 222 will operate together (i.e., based on $V_{MAX}$ and $V_{IN}$) to effectively pull (i.e., regulate, set, etc.) $V_{INTP}$ up to $V_{MAX}$. After $V_{INTP}$ is set, then $V_{INTN}$ is regulated below $V_{INTP}$. In other words, after $V_{INTP}$ is pulled up to $V_{MAX}$, the regulation device 225 (e.g., biased by sinking current source 224) regulates $V_{INTN}$ relative to $V_{INTP}$ by a regulated voltage drop ($V_{REG}$). For example, if $V_{MAX} = 20V$, $V_{REG} = 6V$, and $V_{IN}$ is equal (or close to) $V_{MAX}$, then the floating voltage range will be defined by $V_{INTP} \approx 20V$ and $V_{INTN} \approx 14V$.

Alternatively, the floating supply circuit 220 may pull-down (i.e., float, regulate, set, etc.) the regulated voltage range to $V_{MIN}$ using the sinking current source 224 and the PMOS transistor 223. For example, if $V_{CM} < V_{GND}$ (i.e., $V_{MIN} = V_{CM}$) then the PMOS transistor 223 and the sinking current source 224 will operate together (i.e., based on $V_{MIN}$ and $V_{IN}$) to effectively pull (i.e., regulate, set, etc.) $V_{INTN}$ down to $V_{MIN}$. After $V_{INTN}$ is set, then $V_{INTP}$ is regulated above $V_{INTN}$. In other words, after $V_{INTN}$ is pulled down to $V_{MIN}$, the regulation device 225 (e.g., biased by sourcing current source 222) regulates $V_{INTP}$ relative to $V_{INTN}$ by a regulated voltage rise ($V_{REG}$). For example, if $V_{GND} = -20V$, $V_{REG} = 6V$, and $V_{IN}$ is equal (or close to) $V_{MIN}$, then the floating voltage range will be defined as $V_{INTN} \approx -20V$ and $V_{INTN} \approx -14V$.

The internal power supply 200 self-regulates according to the voltage level (e.g., $V_{CM}$) at the input of the core amplifier. This self-regulation is useful in accommodating a large range of voltages that includes both positive and negative voltages. The range of voltages may extend to voltages that are much higher than the devices in the LV core amplifier are rated. For example, $V_{CM}$ may be in a range of voltages that correspond to the limits of a device technology (e.g., −80V to +80V for devices with a maximum (e.g., $V_{DS}$) rating of 80V), while the devices in the LV core amplifier are rated to receive less than the limits of the device technology (e.g., less than 10 volts). In other words, the fixed voltage range of an external power supply is smaller than the range of common-mode voltages, and the range of common-mode voltages is limited by a device technology, which may be selected as required. The internal power supply provides a consistent voltage level to the LV core amplifier even when $V_{CM}$ changes. This constant power corresponds to a voltage offset $V_{OS}$ of the LV core amplifier and is nearly constant as $V_{CM}$ varies. For example, $V_{OS}$ of a CSA amplifier implementation may have a maximum value of 2 millivolts (mV) over a full $V_{CM}$ range from −80V to +80V. Additionally, a power supply rejection ratio (i.e., PSRR) of the LV core amplifier in the CSA amplifier implementation may have a minimum value of 90 dB over the same range. The values of these parameters are similar to those expected from CSA amplifiers that utilize offset compensation techniques.

Figure 5A:
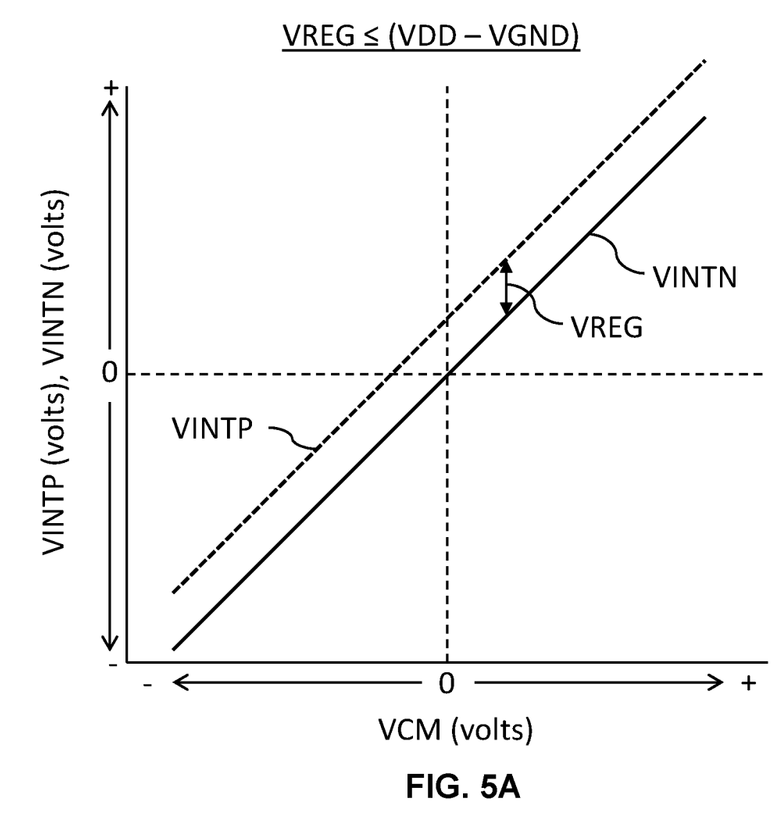
FIG. 5A is a graph of a possible floating voltage range defined by an upper internal voltage ($V_{INTP}$) and a lower internal voltage ($V_{INTN}$), the floating voltage range level shifted according to a common mode voltage ($V_{CM}$) and having a regulated range ($V_{REG}$) that is less than or equal to the external supply range ($V_{DD}$-$V_{GND}$).

FIG. 5A is a graph of a possible floating voltage range (i.e., $V_{INTP} - V_{INTN}$) appearing at the output of the internal power supply 200 for a first possible implementation. The floating voltage range is level shifted (i.e., floated) according to a common mode voltage ($V_{CM}$). For this implementation, $V_{REG}$ (i.e., the floated voltage range) is less than the fixed voltage range ($V_{DD} - V_{GND}$) supplied by the external power supply 110. Accordingly, the voltage regulation device 225 operates for all $V_{CM}$ values. In other words, when $V_{CM}$ is in the range $V_{GND} < V_{CM} < V_{DD}$, the voltage appearing at the terminals of the regulation device 225 in the floating supply circuit 220 remains large enough to maintain voltage regulation. For example, a Zener diode used as the regulation device 225 will remain in breakdown (i.e., will regulate) across the entire range of $V_{CM}$ when $V_{REG} \leq (V_{DD} - V_{GND})$. As a result, the graph shown in FIG. 5A shows no variation of $V_{REG}$ with $V_{CM}$.

Figure 5B:
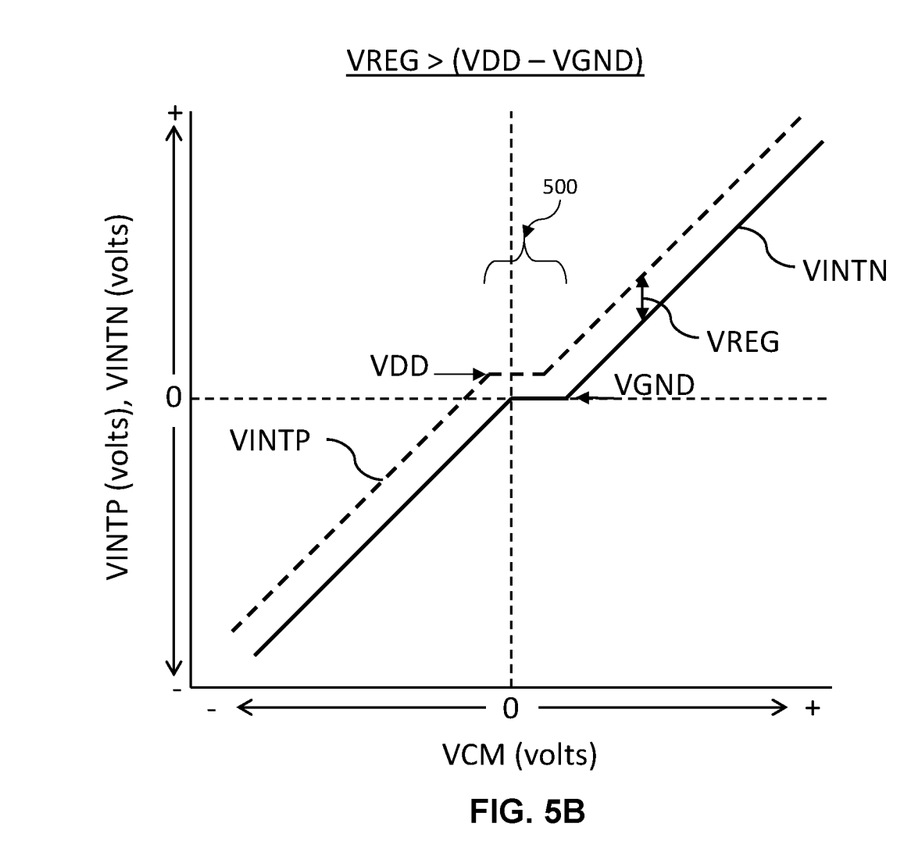
FIG. 5B is a graph of a possible floating voltage range defined by a upper internal voltage ($V_{INTP}$) and a lower internal voltage ($V_{INTN}$), the floating voltage range level shifted according to a common mode voltage ($V_{CM}$) and having a regulated range ($V_{REG}$) that is greater than the external supply range ($V_{DD}$-$V_{GND}$).

FIG. 5B is a graph of a possible floating voltage range (i.e., $V_{INTP} - V_{INTN}$) appearing at the output of the internal power supply 200 for a second possible implementation. The floating voltage range is level shifted according to a common mode voltage ($V_{CM}$). For this implementation, $V_{REG}$ (i.e., the floated voltage range) is greater than the fixed voltage range ($V_{DD} - V_{GND}$) supplied by the external power supply 110. Accordingly, the regulating device does not regulate when $V_{MAX} = V_{DD}$ and $V_{MIN} = V_{GND}$. In other words, when $V_{CM}$ is in a range 500 where $V_{GND} < V_{CM} < V_{DD}$, the voltage appearing at the terminals of the regulation device 225 in the floating supply circuit 220 is not large enough to maintain voltage regulation. As a result, $V_{DD}$ and $V_{GND}$ appear at the output of the floating supply circuit 220 as $V_{INTP}$ and $V_{INTN}$ respectively. For example, a Zener diode used as the regulation device 225 will not remain in breakdown (i.e., will not regulate) in the range 500 where $V_{GND} < V_{CM} < V_{DD}$. As a result, the graph shown in FIG. 5A shows a $V_{REG}$ that varies slightly with $V_{CM}$. The variation is small, because $V_{REG}$ can be selected close (e.g., within a couple of volts) to $V_{DD} - V_{GND}$. Accordingly, the LV core amplifier 140 can still operate with LV devices and any $V_{OS}$ variation with $V_{CM}$ will remain small.

Figure 6:
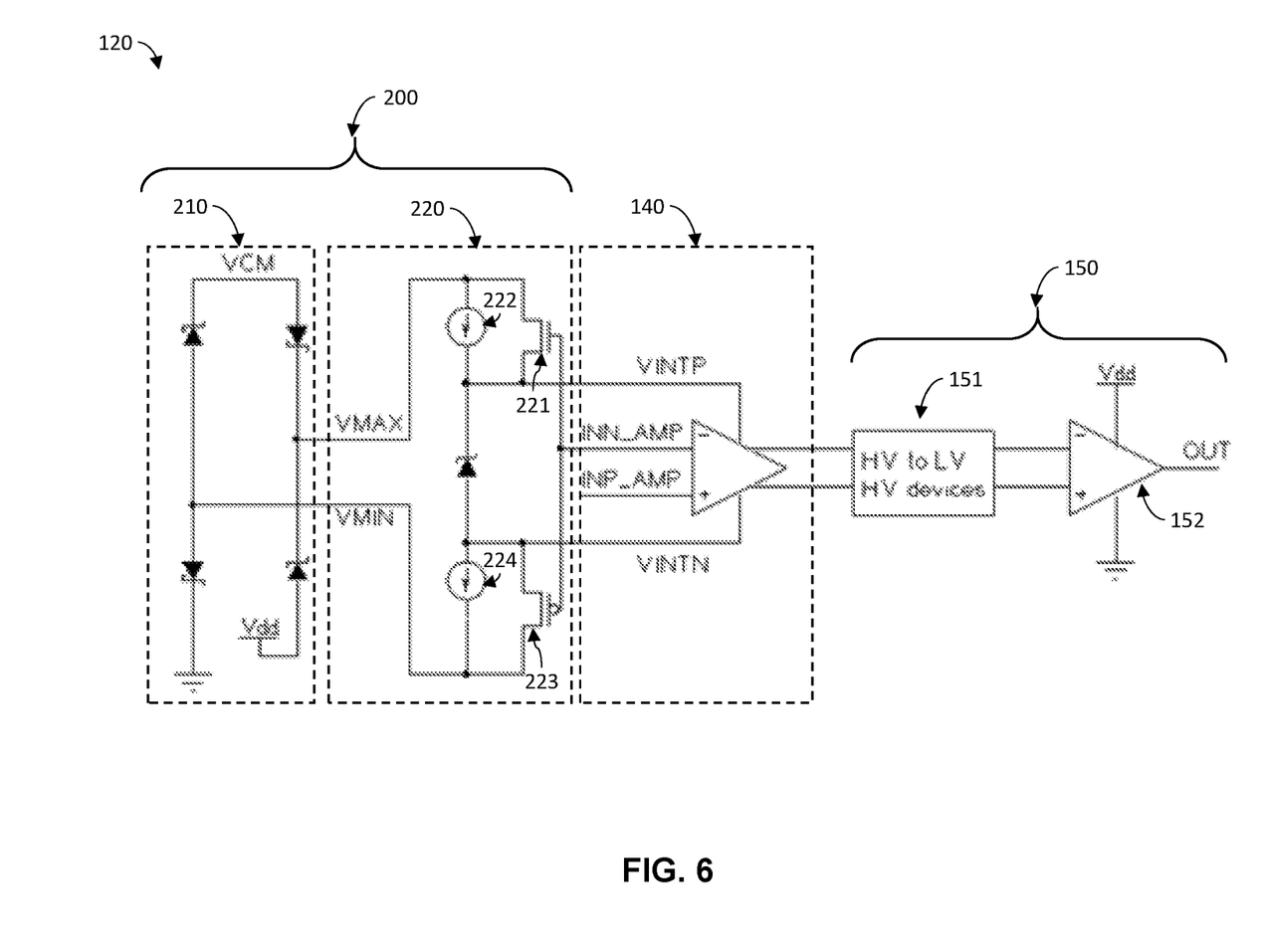
FIG. 6 is a schematic of an amplifier according to a possible implementation of the present disclosure.

FIG. 6 is a schematic of an amplifier 120 according to a possible implementation of the present disclosure. FIG. 6 illustrates the details of the amplifier 120 of FIG. 1, including the connections between the internal power supply 200, the core amplifier 140, and the at least one output stage 150.

The internal supply 200 shown in FIG. 6 produces a low voltage ($V_{INTP} - V_{INTN}$) based on $V_{MAX}$, $V_{MIN}$, and the input (INN_AMP) to the LV core amplifier 140. In the floating supply circuit 220, the sourcing current source 222 (i.e., CS1) can function when $V_{CM}$ is negative and the sinking current source 224 (i.e., CS2) can function when $V_{CM}$ is positive. In some implementations, the sourcing current source 222 and the sinking current source 224 are implemented as current mirror circuits. Also, in the floating supply circuit 220, the NMOS transistor 221 (i.e., M1) and the PMOS transistor 223 (i.e., M2) can be controlled by negative input, INN_AMP, but in alternative implementations the NMOS transistor 221 and the PMOS transistor 223 are controlled by the positive input, INP_AMP. In still other implementations, the gate voltage of the NMOS transistor 221 is at a voltage relative to the gate voltage off PMOS transistor 223. For example, for a current source amplifier INN_AMP and INP_AMP may be coupled to opposite sides of a current carrying resistor.

The LV core amplifier 140 shown in FIG. 6 can be a differential amplifier. The inputs to the amplifier (INP_AMP, INN_AMP) can accommodate high voltages but the differential amplifier is implemented with LV devices because it is powered by a low voltage difference ($V_{INTP} - V_{INTN}$).

A first output stage 151 shown in FIG. 6 can be configured to convert (i.e., level shifts) a high voltage to a low voltage, although in some implementations, the first output stage 151 can convert a low voltage to a high voltage. In either case, the first output stage 151 can include summing nodes and high voltage protection circuits that are implemented with one or more high voltage devices.

A second (i.e., final) output stage 152 shown in FIG. 6 can be a standard amplifier output stage to provide the output signal with sufficient output power in the form of voltage or current. For example, the final output stage 152 can be a class AB amplifier stage.

Figure 7:
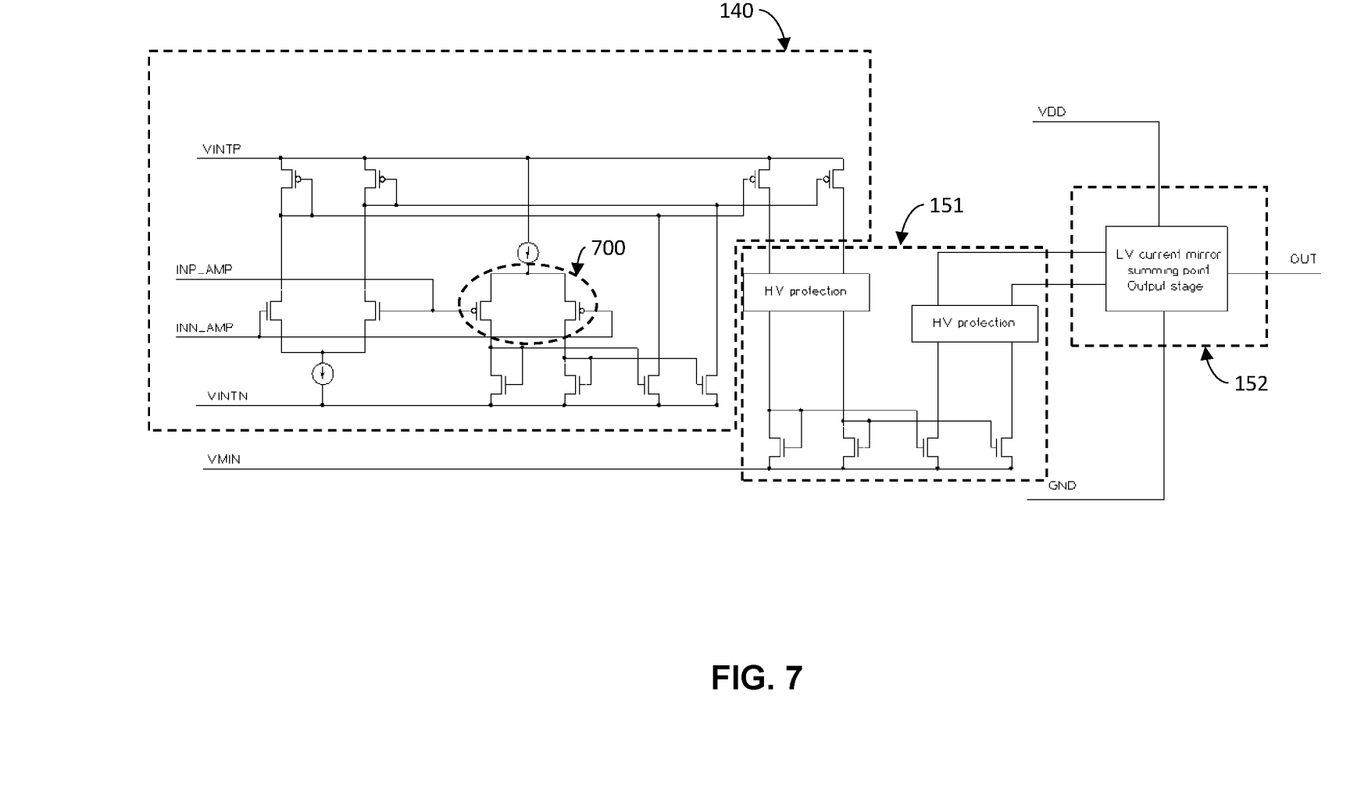
FIG. 7 is a detailed schematic of a possible implementation of a portion of the amplifier shown in FIG. 6.

FIG. 7 is a detailed schematic of a possible implementation of a portion of the amplifier shown in FIG. 6. The portion shown includes the LV core amplifier 140, the first output stage 151, and the second (i.e., final) output stage 152. For the implementation shown, a differential pair 700 of the LV core amplifier 140 is supplied between $V_{INTP}$ and $V_{INTN}$. The voltage range shift from the LV core amplifier 140 stage to the final output stage 152 can be accomplished using current mirrors, which have HV protection. These circuits are the circuits (e.g., only circuits) in which HV devices are used. One advantage of this implementation is the fact that the HV devices after the input stage do not negatively affect the performance (e.g., $V_{OS}$) of the amplifier 120.

Figure 8:
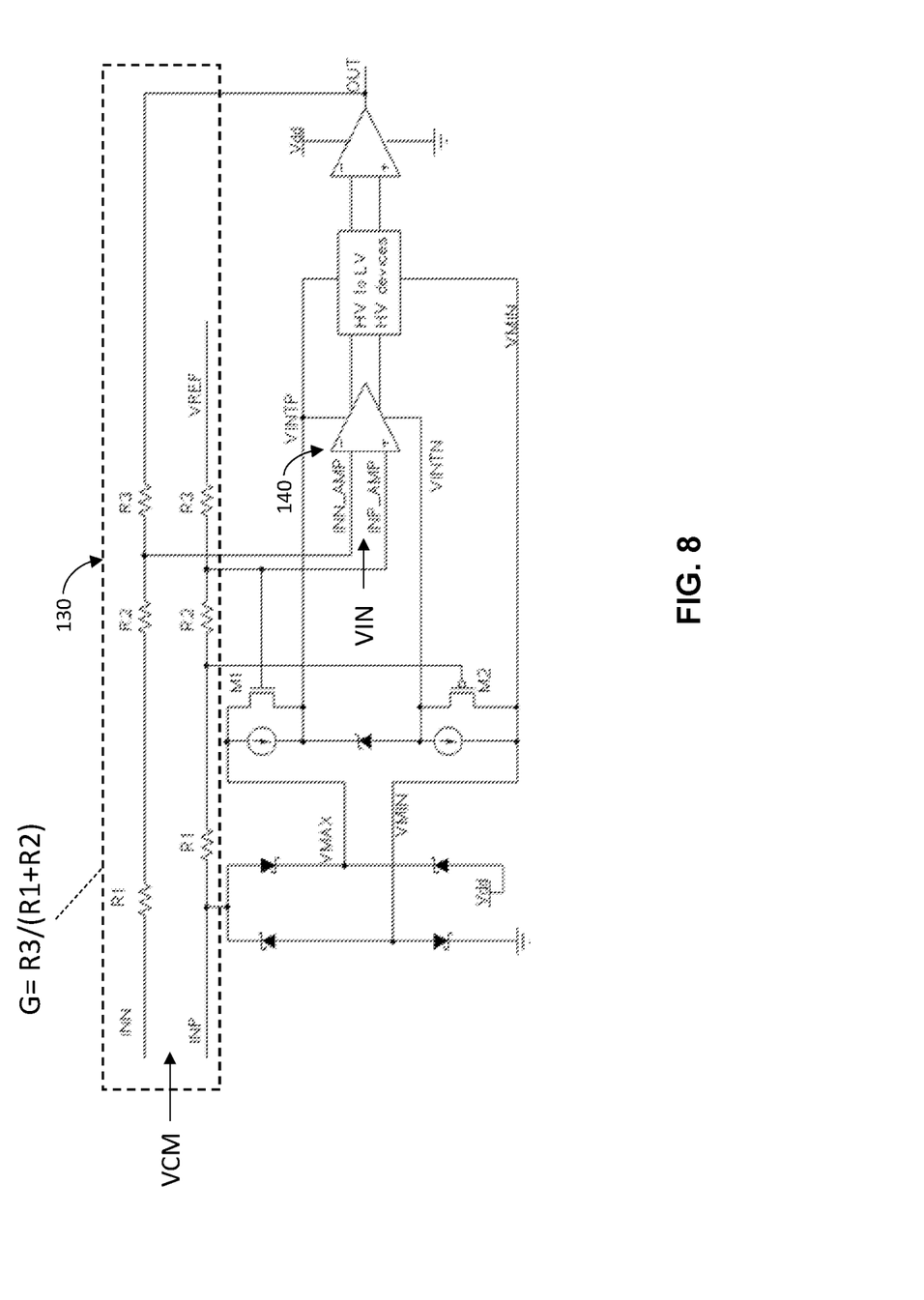
FIG. 8 is a schematic the amplifier shown in FIG. 6 configured as a current-sense amplifier (CSA) according to a possible implementation of the present disclosure.

FIG. 8 is a schematic the amplifier shown in FIG. 6 configured as a current-sense amplifier (CSA) according to a possible implementation of the present disclosure. As shown, the amplifier 120 includes a current-sense (CS) resistor network 130 for sensing the current. The transistors M1 and M2 may be biased at different points along the CS resistor network 130. An advantage of this approach is that the various bias points can be used to adjust the gate to source voltages of the transistor M1 and M2 to ensure a correct voltage level for VINTP and/or VINTN. The disclosure circuits and techniques may offer similar performance as CSA amplifiers that utilize chopping to improve CMRR. For example, the CSA amplifier of the disclosure may have a minimum CMRR of 90 dB.

For the implementation shown in FIG. 8, the input of the LV core amplifier 140 (i.e., INN_AMP, INP_AMP) is coupled to the input of the amplifier 120 (I.e., INN, INP) through the CS resistor network. Accordingly, a voltage (e.g., VCM) at the input of the amplifier 120 may differ from a voltage (e.g., VIN) at the input of the LV core amplifier 140. The difference can depend on the implementation (e.g., resistor values) of the CS resistor network 130 and/or how it is coupled to the other stages in the amplifier 120. The LV core amplifier includes feedback through the CS resistor network 130. Accordingly, the CS resistor network 130 provides a gain (G). The gain of the CS resistor network 130 shown in FIG. 8 R3/(R1+R2). When the gain is high, $V_{IN}$ is approximately equal to $V_{CM}$. However, as the gain is reduced, the difference between $V_{IN}$ and $V_{IN}$ becomes larger.

Figure 9:
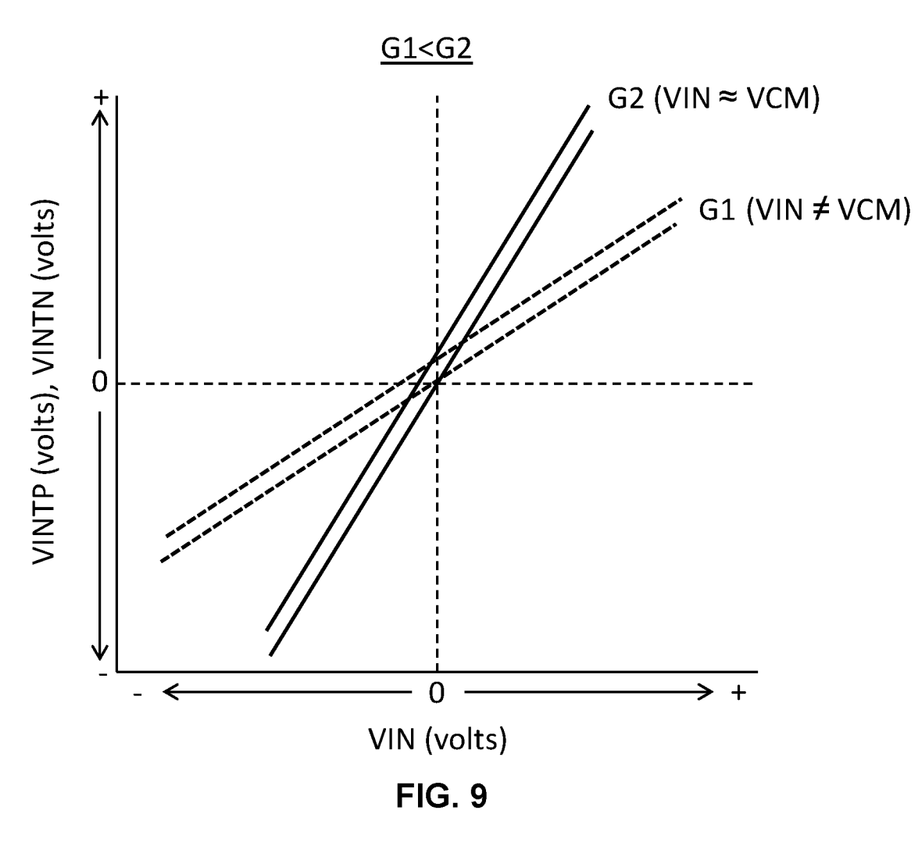
FIG. 9 is a graph of possible floating voltage ranges that are associated with implementations of a current sense amplifier with different gains.

The effect of the CSA gain on the floating voltage range is shown in FIG. 9. FIG. 9 is a graph of possible floating voltage ranges for current sense amplifiers having different gains. As shown, the slope of the floating voltage range changes but floats as expected for any gain option. All gain values can be accommodated because the input voltage of the core amplifier ($V_{IN}$) is used to control the floating supply circuit 220 rather than an input voltage of the amplifier ($V_{CM}$). This means that for gains in which $V_{CM}$ and $V_{IN}$ deviate from one another, the voltage supplying the LV core amplifier will always be floated by the appropriate amount. Thus, an advantage of the disclosed circuits and techniques is the CSA architecture is not limited to any particular gains or resistance values of the CS resistor network 130.

Figure 10:
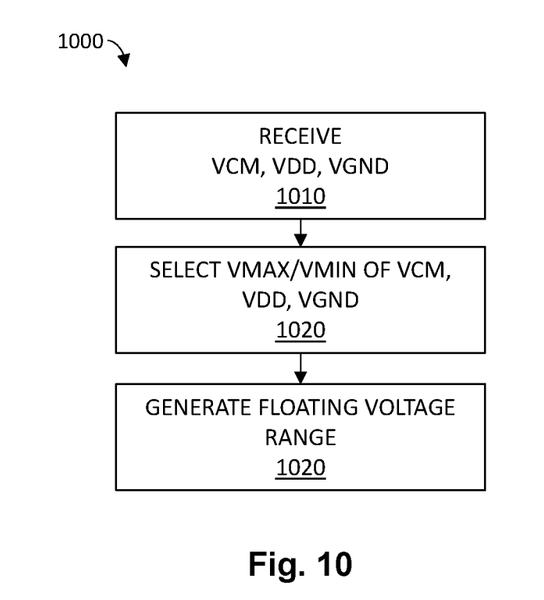
FIG. 10 is a flow chart of a method for operating an amplifier over a range of possible common mode voltages.

FIG. 10 is a flow chart of a method for operating an amplifier over a range of possible common mode voltages without an input stage of the amplifier using (i.e., including) devices rated for the entire range of possible common mode voltage (i.e., the input stage of the amplifier uses only LV devices). The method 1000 includes receiving 1010 a fixed voltage range ($V_{DD}$-$V_{GND}$) and an input voltage ($V_{CM}$) at the amplifier. A maximum ($V_{MAX}$) and a minimum ($V_{MIN}$) of $V_{DD}$, $V_{GND}$, and $V_{CM}$ are the selected 1020 and used to generate 1020 a floating voltage range. The floating voltage range is a regulated voltage range that is level shifted to VMAX or VMIN according got an input voltage ($V_{IN}$) at a first (i.e., input) stage of the amplifier. The floated voltage range allows the amplifier to include (e.g., only include) device rated for the regulated voltage range (i.e., not the common mode voltage at the input to the first stage).

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, a singular form may, unless definitely indicating a particular case in terms of the context, include a plural form.

It will be understood that, in the foregoing description, when an element, such as a component is referred to as being on, connected to, electrically connected to, coupled to, or electrically coupled to another element, it may be directly on, connected or coupled to the other element, or one or more intervening elements may be present. It will also be understood that, in the foregoing description, when a pair of voltages has constituent voltages described as positive or negative, this description is in reference to the relationship between the voltages in the pair and not necessarily in reference to the absolute value of each voltage. Likewise, when a terminal (i.e., connector, input) of a pair of terminals is described as positive or negative, this description is in reference to a voltage/current expected at the terminal in relation to the other terminal and not necessarily in reference to the absolute value of the voltage/current at the terminal.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A system comprising:
an external power supply configured to generate a fixed voltage range defined by an upper external voltage ($V_{DD}$) and a lower external voltage ($V_{GND}$);
an amplifier coupled to the external power supply and configured to receive an input signal that has a common-mode voltage ($V_{CM}$) within a range of common-mode voltages, the amplifier including:

a low-voltage (LV) core amplifier configured to amplify an input voltage ($V_{IN}$), the LV core amplifier configured to operate at low voltages relative to the range of common-mode voltages;

an internal power supply providing power to the LV core amplifier for operation, the internal power supply configured to generate a floating voltage range defined by an upper internal voltage ($V_{INTP}$) and a lower internal voltage ($V_{INTN}$), the floating voltage range level-shifted to $V_{CM}$ based on $V_{IN}$ so that an output of the LV core amplifier is in a first voltage range that corresponds to the floating voltage range, the internal power supply including a selector circuit configured to select a maximum voltage ($V_{MAX}$) as the larger of the common mode voltage ($V_{CM}$) and the upper external voltage ($V_{DD}$) and a minimum voltage ($V_{MIN}$) as the smaller of the common mode voltage ($V_{CM}$) and the lower external voltage ($V_{GND}$); and at least one output stage that is powered by the external power supply, the at least one output stage configured to level-shift the output of the LV core amplifier from the floating voltage range to a second voltage range that corresponds to the fixed voltage range.

2. The system according to claim 1, wherein the range of common-mode voltages includes positive and negative voltages.

3. The system according to claim 1, wherein the fixed voltage range is smaller than the range of common-mode voltages, and the range of common-mode voltages is limited by a device technology.

4. The system according to claim 1, wherein the amplifier is a general purpose amplifier and $V_{IN}$ equals $V_{CM}$.

5. The system according to claim 1, wherein the amplifier is a current-sense amplifier and the LV core amplifier is configured by a current sense resistor network to provide a gain.

6. The system according to claim 5, wherein $V_{CM}$ and $V_{IN}$ differ according to the current sense resistor network.

7. The system according to claim 1, wherein the LV core amplifier includes low voltage devices operating at voltages that are low relative to the range of common-mode voltages to obtain a performance improvement from the amplifier.

8. The system according to claim 7, wherein the performance improvement is an increase in a common-mode rejection ratio.

9. The system according to claim 7, wherein the performance improvement is a decrease in a voltage offset ($V_{OS}$).

10. The system according to claim 7, wherein the performance improvement is a decrease in a die area required for the amplifier.

11. The system according to claim 1, wherein the selector circuit includes a first pair of cathode connected Schottky diodes cathode connected between $V_{CM}$ and $V_{DD}$ to determine $V_{MAX}$, and a second pair of anode connected Schottky diodes cathode connected between $V_{CM}$ and $V_{DD}$ to determine $V_{MIN}$.

12. The system according to claim 11, wherein the selector circuit includes a pair of drain-connected PMOS transistors connected between, and switched by, $V_{CM}$ and $V_{DD}$ to determine $V_{MAX}$, and a pair of drain-connected NMOS transistors connected between, and switched by, $V_{CM}$ and $V_{GND}$ to determine $V_{MIN}$.

13. The system according to claim 11, wherein the internal power supply includes a floating supply circuit configured:

to pull $V_{INTP}$ up to $V_{CM}$ and to regulate $V_{INTN}$ relative to $V_{INTP}$ when $V_{CM}$ is selected as $V_{MAX}$; and to pull $V_{INTN}$ down to $V_{CM}$ and to regulate $V_{INTP}$ relative to $V_{INTN}$ when $V_{CM}$ is selected as $V_{MIN}$.

14. A method for operating an amplifier that uses low voltage devices over a high voltage range of common mode voltages, the method comprising:

receiving, at the amplifier, a fixed voltage range defined by an upper external voltage ($V_{DD}$) and a lower external voltage ($V_{GND}$);

receiving a common mode voltage ($V_{CM}$) at an input to the amplifier, $V_{CM}$ in a range of common mode voltages, the range common mode voltages including a positive voltage and a negative voltage;

selecting a voltage maximum ($V_{MAX}$) as the larger of the common mode voltage ($V_{CM}$) and the upper external voltage ($V_{DD}$) and a voltage minimum ($V_{MIN}$) as the smaller of the common mode voltage ($V_{CM}$) and the lower external voltage ($V_{GND}$); and generating a floating voltage range to power an input stage of the amplifier, the floating voltage range level-shifted to $V_{MAX}$ or $V_{MIN}$ according to an input voltage ($V_{IN}$) to an input stage of the amplifier.

15. The method according to claim 14, wherein the generating a floating voltage range to power the input stage of the amplifier, comprises:

pulling an upper internal voltage ($V_{INTP}$) up to $V_{CM}$ when $V_{CM}$ is selected as $V_{MAX}$; and pulling a lower internal voltage ($V_{INTN}$) down to $V_{CM}$ when $V_{CM}$ is selected as $V_{MIN}$.

16. The method according to claim 15, wherein the generating a floating voltage range to power the input stage of the amplifier, further comprises:

regulating $V_{INTN}$ relative to $V_{INTP}$ when $V_{INTP}$ is pulled up to $V_{CM}$; and regulating $V_{INTP}$ relative to $V_{INTN}$ when $V_{INTP}$ is pulled down to $V_{CM}$.

17. The method according to claim 14, wherein the amplifier is a current sense amplifier that includes a current-sense (CS) resistor network and $V_{IN}$ differs from $V_{CM}$ by an amount determined by the CS resistor network.

18. An internal power supply for an amplifier that is configured to receive a range of common mode voltages that includes positive and negative voltages, the internal power supply comprising:

a selector circuit configured to receive a common mode voltage ($V_{CM}$) from an input to the amplifier and receive an upper external voltage ($V_{DD}$) and a lower external voltage ($V_{GND}$) from an external power supply, the selector circuit configured to select a maximum voltage ($V_{MAX}$) as the larger of the common mode voltage ($V_{CM}$) and the upper external voltage ($V_{DD}$) and a minimum voltage ($V_{MIN}$) as the smaller of the common mode voltage ($V_{CM}$) and the lower external voltage ($V_{GND}$); and a floating supply circuit configured to receive $V_{MAX}$ and $V_{MIN}$ from the selector circuit and input voltage ($V_{IN}$) from a input stage of the amplifier, the floating supply circuit configured to generate a floating voltage range defined by an upper internal voltage ($V_{INTP}$) and a lower internal voltage ($V_{INTN}$), the floating voltage range level-shifted to $V_{CM}$ based on $V_{IN}$.

19. The internal power supply for an amplifier according to claim 18, wherein the amplifier is a current sense amplifier.

* * * * *